US006954134B2

(12) United States Patent
Leichtfried et al.

(10) Patent No.: US 6,954,134 B2
(45) Date of Patent: Oct. 11, 2005

(54) APPARATUS AND METHOD FOR TIMING AN OUTPUT OF A REMOTE KEYLESS ENTRY SYSTEM

(75) Inventors: Wilhelm Leichtfried, Sterling Heights, MI (US); Robert Pizzuti, Rochester Hills, MI (US)

(73) Assignee: Alps Automotive, Inc., Auburn Hills, MI (US)

(*) Notice: Subject to any disclaimer, the term of this patent is extended or adjusted under 35 U.S.C. 154(b) by 520 days.

(21) Appl. No.: 09/967,330

(22) Filed: Sep. 28, 2001

(65) Prior Publication Data

US 2003/0067398 A1 Apr. 10, 2003

(51) Int. Cl.[7] ............................ H04Q 9/00; H04Q 1/00; G08C 19/00; H03M 11/00

(52) U.S. Cl. ................................ 340/5.61; 340/825.54; 340/825.72; 341/24

(58) Field of Search ............................... 340/5.61–5.64, 340/825.54, 825.31, 825.69, 825.72; 341/24

(56) References Cited

U.S. PATENT DOCUMENTS

| | | | | |
|---|---|---|---|---|
| 5,436,897 A | * | 7/1995 | Cook | 370/212 |
| 5,828,316 A | | 10/1998 | DiCroce | |
| 5,838,257 A | * | 11/1998 | Lambropoulos | 340/5.61 |
| 5,952,933 A | * | 9/1999 | Issa et al. | 340/5.26 |
| 6,034,593 A | | 3/2000 | Chase et al. | |
| 6,064,705 A | * | 5/2000 | Zalud et al. | 375/361 |
| 6,396,389 B1 | | 5/2002 | Nakano et al. | |
| 6,570,486 B1 | * | 5/2003 | Simon et al. | 340/5.1 |
| 6,617,961 B1 | * | 9/2003 | Janssen et al. | 340/5.8 |

* cited by examiner

*Primary Examiner*—Michael Horabik
*Assistant Examiner*—Scott Au
(74) *Attorney, Agent, or Firm*—Brinks Hofer Gilson & Lione

(57) ABSTRACT

A crystal-less keyless entry system includes a microprocessor or micro controller, a timing circuit, and a radio frequency circuit. The timing circuit is a unitary part of the microprocessor. When configured to compensate for power up delays in the radio frequency circuit, the microprocessor outputs data having stretch times that compensate for power up delays in the radio frequency circuit. The stretch times do not substantially vary the substantially constant bit time periods of the output data. When configured to detect a switch activation, the microprocessor transmits a bit within a period that includes a debounce time interval. The method of transmitting data using a crystal-less remote keyless entry system includes selecting a bit from a data stream and encoding the bit with a Manchester like encoding process. The Manchester like encoding process debounces a switch between logic levels of the encoded data.

23 Claims, 13 Drawing Sheets

Digital Message Output

APPARATUS AND METHOD FOR TIMING AN OUTPUT OF A REMOTE KEYLESS ENTRY SYSTEM

CROSS REFERENCE TO RELATED APPLICATIONS

The following co-pending and commonly assigned U.S. patent applications have been filed on the same day as this application. Each of these applications relate to and further describe other aspects of the presently preferred embodiments disclosed in this application and are incorporated by reference in their entirety.

U.S. patent application Ser. No. 09/967,339 "Apparatus and Method of Calibrating a Keyless Transmitter," filed on Sep. 28, 2001.

U.S. patent application Ser. No. 09/967,488, "Apparatus and Method for Calibrating a Timing Circuit in A Remote Keyless Entry System Using Programmable Commands," filed on Sep. 28, 2001, and is now U.S. Pat. No. 6,643,598.

BACKGROUND

This invention relates to a wireless transmitter, and more particularly, to a wireless transmitter used with a Keyless Entry System.

A Keyless Entry System ("RKE") allows a user to lock and unlock doors, sound a panic alarm, program seat and mirror positions, open a trunk, and/or perform other functions using a transmitter.

In Keyless Entry Systems, one or more unique identifying codes are programmed into the transmitter. In these Keyless Entry Systems, the transmitter and a receiver use a defined communication protocol. The communication protocol defines the timing of the bit stream and the tolerances. The transmitter can include a microprocessor that transmits according to a communication protocol. In some Keyless Entry Systems an external oscillator is required to provide a stable and accurate clock reference to the microprocessor. These oscillator circuits can comprise multiple parts that include an external crystal or an external resonator.

In some instances, multiple parts that include an external crystal or an external resonator, for example, can decrease the durability and increase the complexity, the size, the cost of manufacturing, and the cost of assembly of some Keyless Entry Systems. The increased cost of these Keyless Entry Systems can be especially high when large numbers of Keyless Entry Systems are manufactured and/or assembled.

BRIEF DESCRIPTION OF THE DRAWINGS

In the figures, like reference numbers designate similar parts through different views.

SUMMARY

A first presently preferred embodiment comprises a micro-controller or microprocessor, a timing circuit, and a radio frequency circuit. Preferably, the presently preferred timing circuit is a unitary part of the presently preferred micro-controller or microprocessor. The presently preferred microprocessor is preferably configured to compensate for power up delays in the presently preferred radio frequency circuit. In this presently preferred embodiment, the presently preferred microprocessor outputs data having stretch times that compensate for power up delays in the presently preferred radio frequency circuit. Preferably, the stretch times do not affect the substantially constant bit time periods of the output data.

A second presently preferred embodiment configures the presently preferred microprocessor to transmit a bit within a time period that includes a debounce time interval. In this presently preferred embodiment, a switching event is processed in parallel with a radio frequency transmission of the presently preferred radio frequency circuit.

A presently preferred method of transmitting data using a crystal-less remote keyless entry system includes selecting a bit from a data stream and encoding that bit with a presently preferred Manchester like encoding. The presently preferred Manchester like encoding debounces a switch within a time period between logic levels of the encoded data.

Other apparatuses, systems, methods, features, and advantages of the presently preferred embodiments will become apparent to one with skill in the art upon examination of the figures and detailed description. It is intended that all such additional apparatuses, systems, methods, features and advantages be included within this description, be within the scope of the invention, and be protected by the accompanying claims.

DETAILED DESCRIPTION OF THE PRESENTLY PREFERRED EMBODIMENTS

The presently preferred Remote Keyless Entry System ("RKE") provides users with a convenient apparatus and method for controlling vehicle or other remote structures and systems. The presently preferred Remote Keyless Entry System allows a presently preferred transmitter to be concealed in a housing, a key, a card, a fob, or another device. When activated, the presently preferred transmitter communicates with a receiver or transceiver. Preferably, the communication between the presently preferred transmitter and receiver authorizes access to a vehicle or another remote structure or system. The presently preferred apparatus and method is preferably mechanically activated. However, a preferred alternative apparatus and method can be a unitary part of a hands free system that automatically authorizes access or actuates a function when the transmitter is in proximity to the receiver. Alternatively, the presently preferred apparatus and method can be voice activated.

Figure 1:
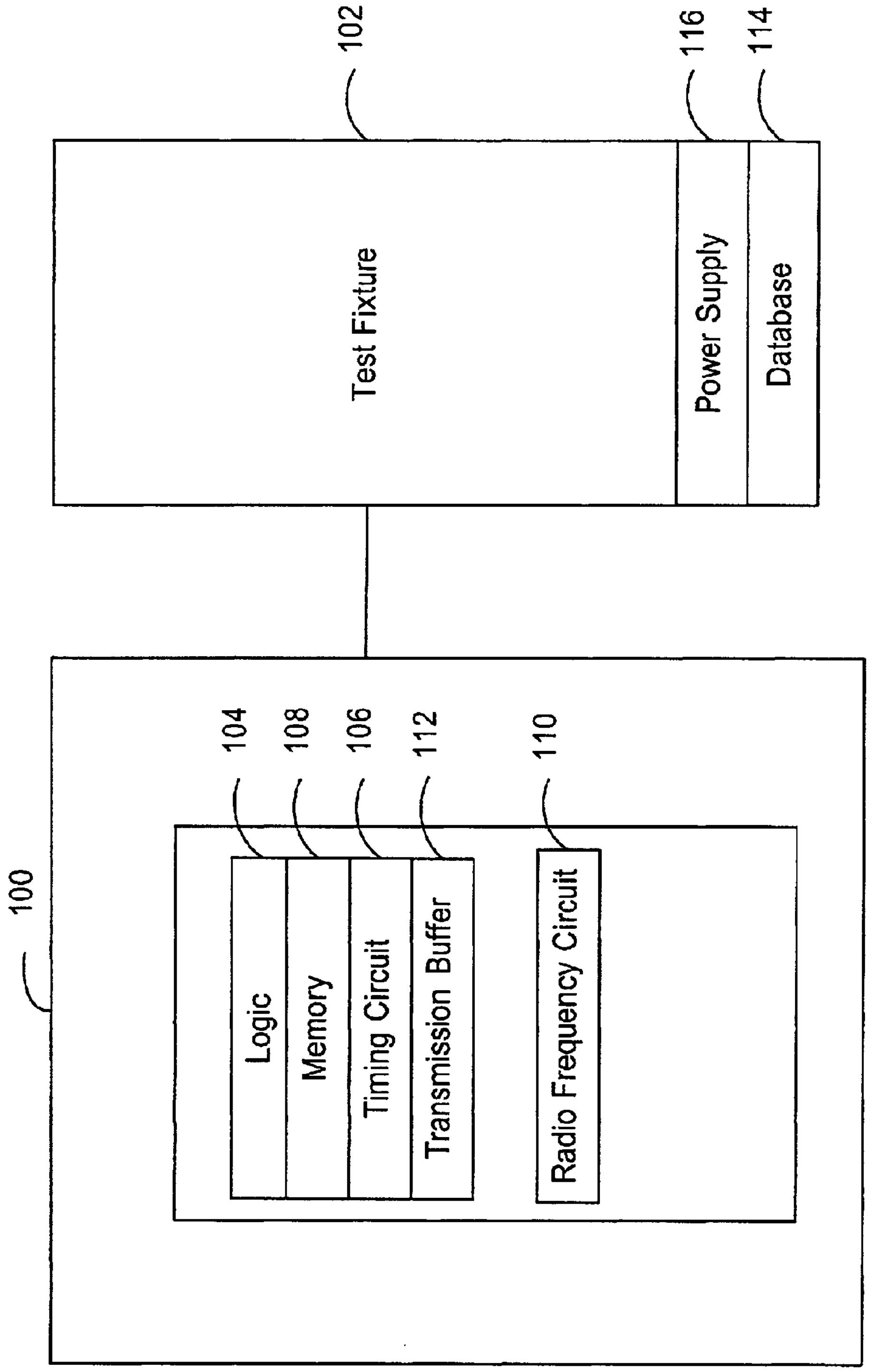
FIG. 1 is a block diagram of a presently preferred embodiment.

FIG. 1 is a block diagram of a presently preferred transmitter 100 in communication with a presently preferred test fixture ("tester") 102. As shown, the presently preferred transmitter 100, which in other presently preferred embodiments is a transceiver, includes a microprocessor 104. Preferably, the presently preferred microprocessor 104 is a unitary part of a presently preferred timing circuit 106. The presently preferred timing circuit 106 preferably generates a varying output at a controlled frequency without using a crystal ("crystal-less"). This constant or adjustable output is referred to as a "clock" frequency in this detailed description. Preferably, the "clock" frequency drives only the microprocessor 104. However, in other presently preferred embodiments the "clock" frequency can drive other circuits or devices.

In one presently preferred embodiment, the presently preferred timing circuit 106 comprises an array of capacitors that are individually selected by transistors under the control of an oscillator calibration ("OSCCAL") register resident to the microprocessor 104. In this presently preferred embodiment the oscillator calibration register is six bits long, although other register lengths can also be used. Preferably, the six bits represent binary count values that range from zero to sixty-three ("000000" to "111111"). Thus, the greatest number of bit changes occurs through the transition from fifteen to sixteen ("001111" to "010000"), from thirty-one to thirty-two ("011111" to "100000"), and from forty-seven to forty-eight ("101111" to "110000").

Figure 2:
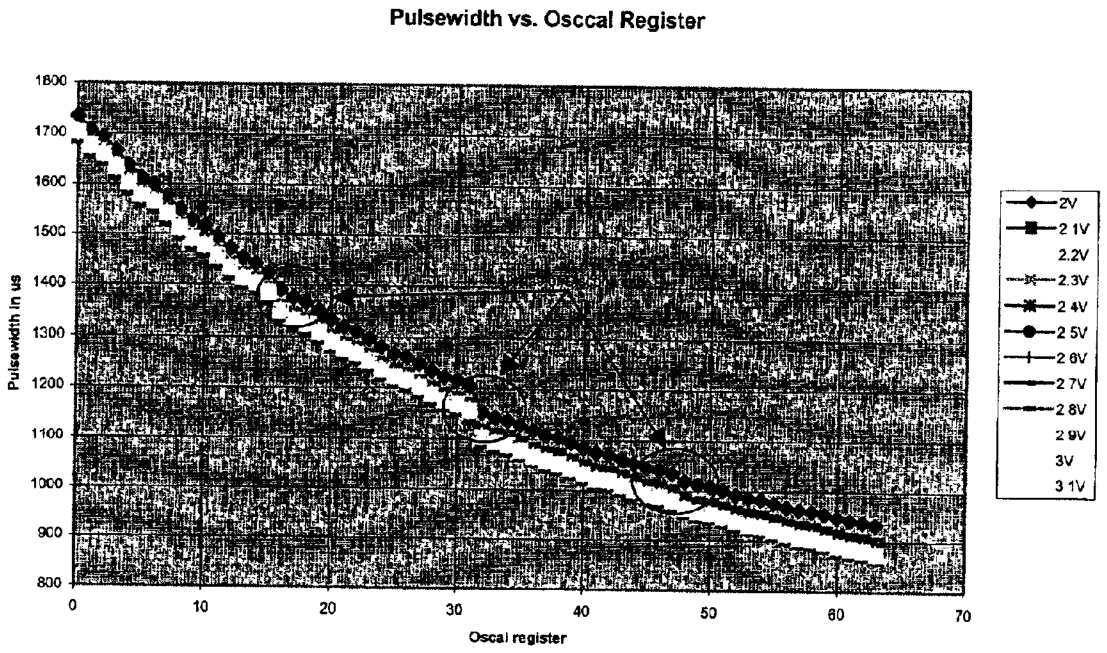
FIG. 2 is an exemplary graph illustrating oscillator discontinuities.

As shown in FIG. 2, areas of discontinuity can occur near or between these transition values. The exemplary graph further shows that the pulse width of the "clock" varies with variations in voltage. Thus, a proper timing frequency or "clock" is preferably calibrated through at least a desired frequency spectrum which can include one or more areas of discontinuity. To compensate for voltage variations, the "clock" is preferably calibrated through an expected operating voltage range.

I. K-Factor

Figure 3:
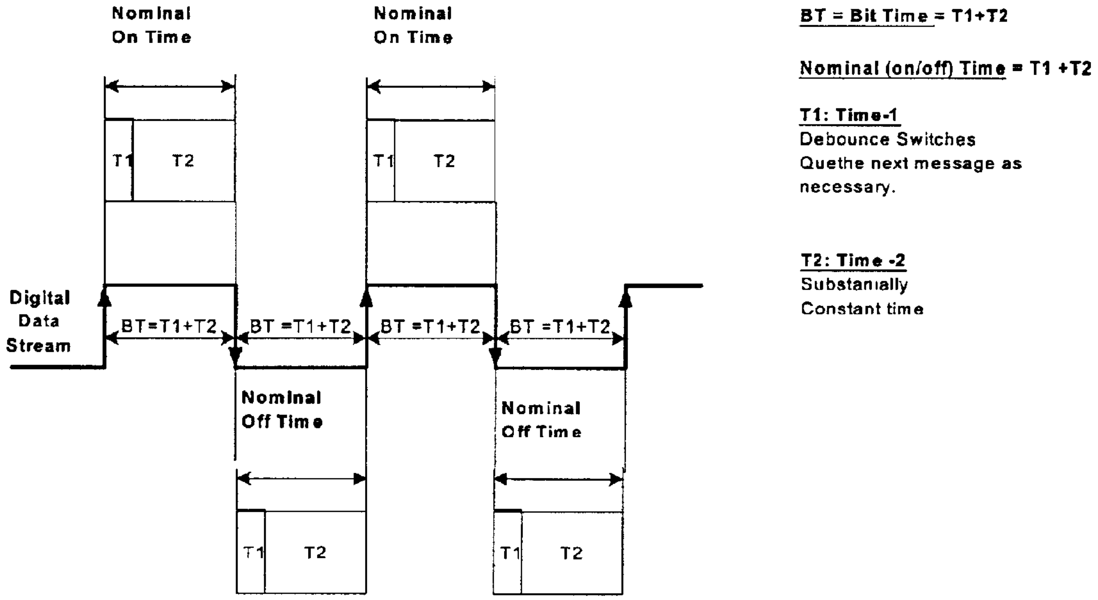
FIG. 3 is an exemplary timing diagram of a preferred digital data stream generated by a preferred transmitter.

As shown in FIG. 3, the bit times of data transmitted from the presently preferred transmitter 100 is based on an instruction cycle counting. An instruction cycle, for a given microprocessor at a preferred operating frequency, is a known amount of time needed to execute one instruction. For example, it can take one microsecond to execute an instruction when a preferred microprocessor is operating at four megahertz.

Preferably, a bit time period of the data transmitted from the presently preferred transmitter 100 is comprised of multiple periods of time needed to execute a fixed instruction and one or more adjustable instructions. Preferably, a fixed instruction is an instruction that performs a necessary function. In this presently preferred embodiment, a debounce instruction is a fixed instruction. Preferably, an adjustable instruction is a delaying instruction that is executed to maintain a substantially constant bit time period. In this presently preferred embodiment, the number of adjustable instructions that must be executed to maintain a substantially constant bit time period is called a K-factor. In this presently preferred embodiment, the K-factor is an integer constant. In alternative preferred embodiments, the K-factor can comprise one or more real numbers programmed to avoid one or multiple frequency discontinuities that occur through a frequency range.

More precisely, in this presently preferred embodiment the K-factor generates a substantially constant time T2 added to a debounce time T1. Preferably the substantially constant time T2 is a period of time that avoids a frequency discontinuity and further synchronizes communication with a receiver that is integrated within a vehicle, house, enclosure, or other device or structure. For a given operating frequency, the substantially constant time T2 changes when the presently preferred transmitter 100 is calibrated.

Preferably, T1 represents a time needed to detect a switch activation. In this presently preferred embodiment, when the presently preferred transmitter 100 is activated by a switch the opening and closing of that switch may not generate a uniform signal as the switch output transitions between logic states. Instead, the transition can comprise a transient that results from the switch contacts "bouncing" during the switch transition. To ensure that the transient does not cause the microprocessor 104 to detect phantom switching events, preferably a debounce period T1 is added to the constant time period T2 in this presently preferred embodiment. Preferably, during this debounce period an input port is sampled and occurring commands are queued. This guarantees that no switch event is missed during transmission.

II. Calibration

Figure 4:
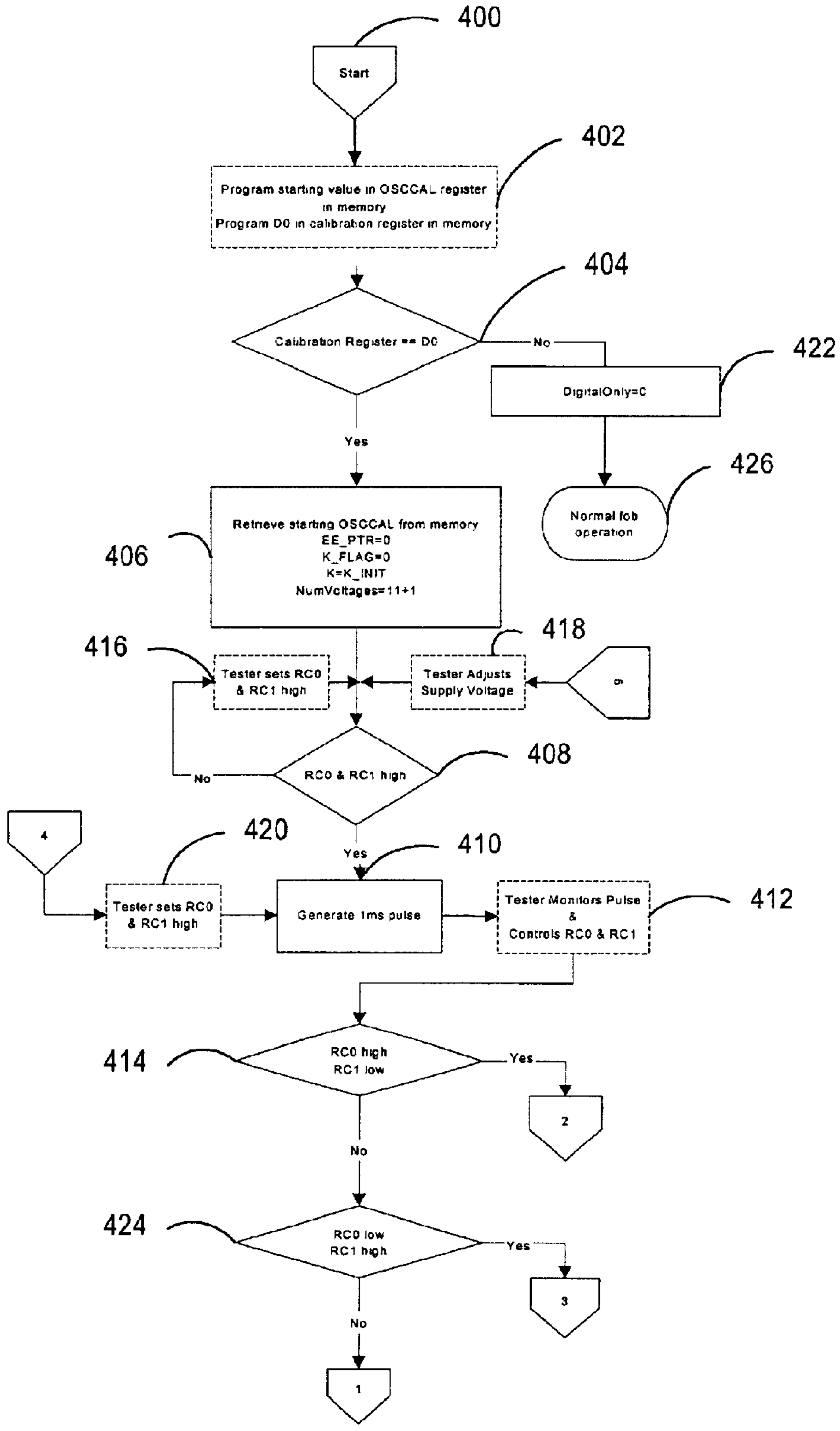
FIGS. 4–6 are flow diagrams of a preferred calibration routine of the preferred transmitter.

Although communication between the presently preferred transmitter 100 and receiver is preferably an asynchronous process, the "clock" of the presently preferred timing circuit is preferably adjusted to avoid frequency discontinuities and compensated for voltage and temperature variations. As shown in FIG. 4, a presently preferred calibration process can be used to generate data used for adjusting the presently preferred timing circuit 106 in the presently preferred transmitter 100 during a normal operation. The presently preferred calibration process also validates the calibration data and triggers a transmission and validates the bit times.

As shown, the boxes outlined in continuous lines represent functions that are performed by the presently preferred transmitter 100. The dashed boxes represent the functions that are performed by the presently preferred test fixture 102.

Figure 5:
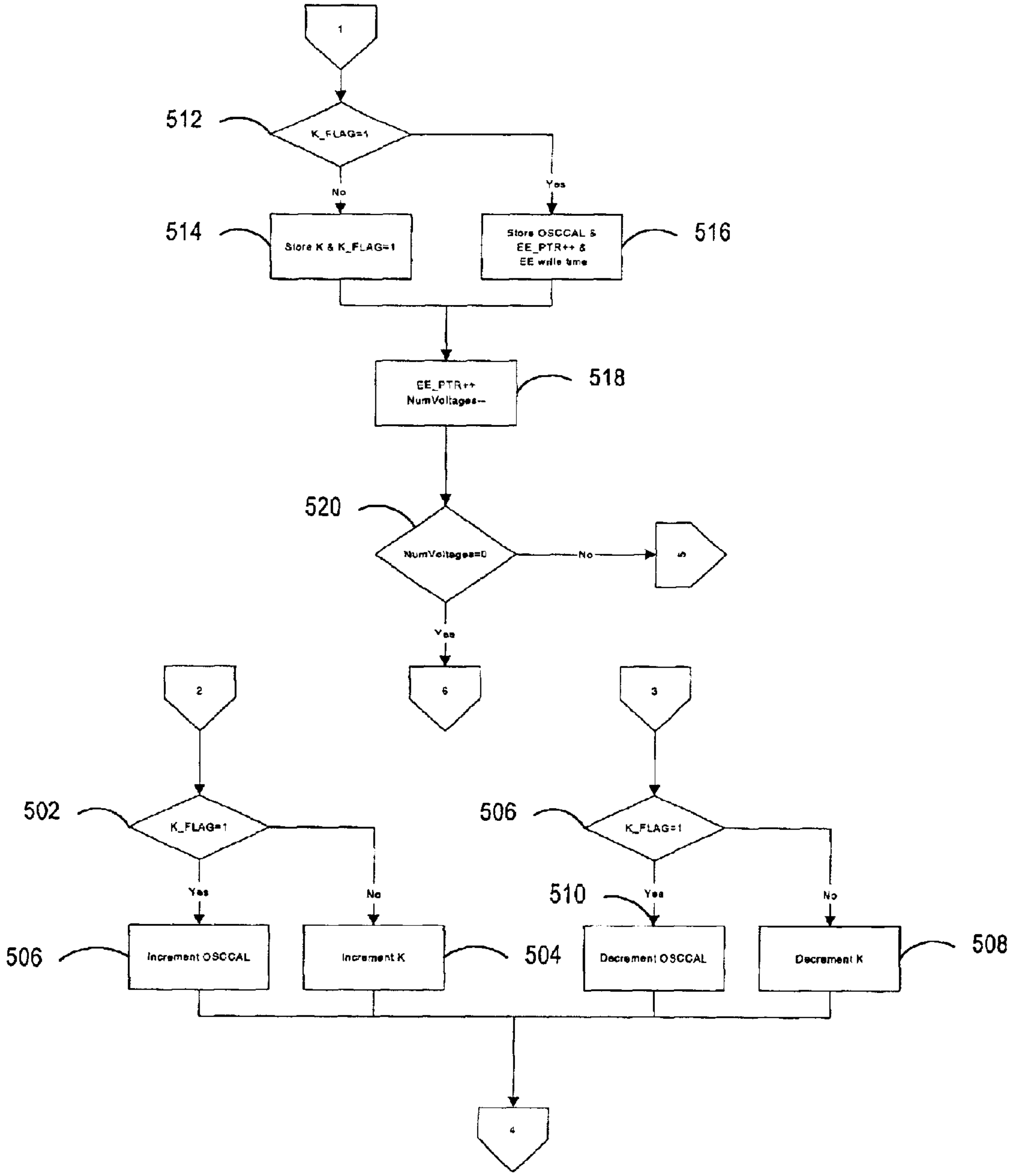
Figure 6:
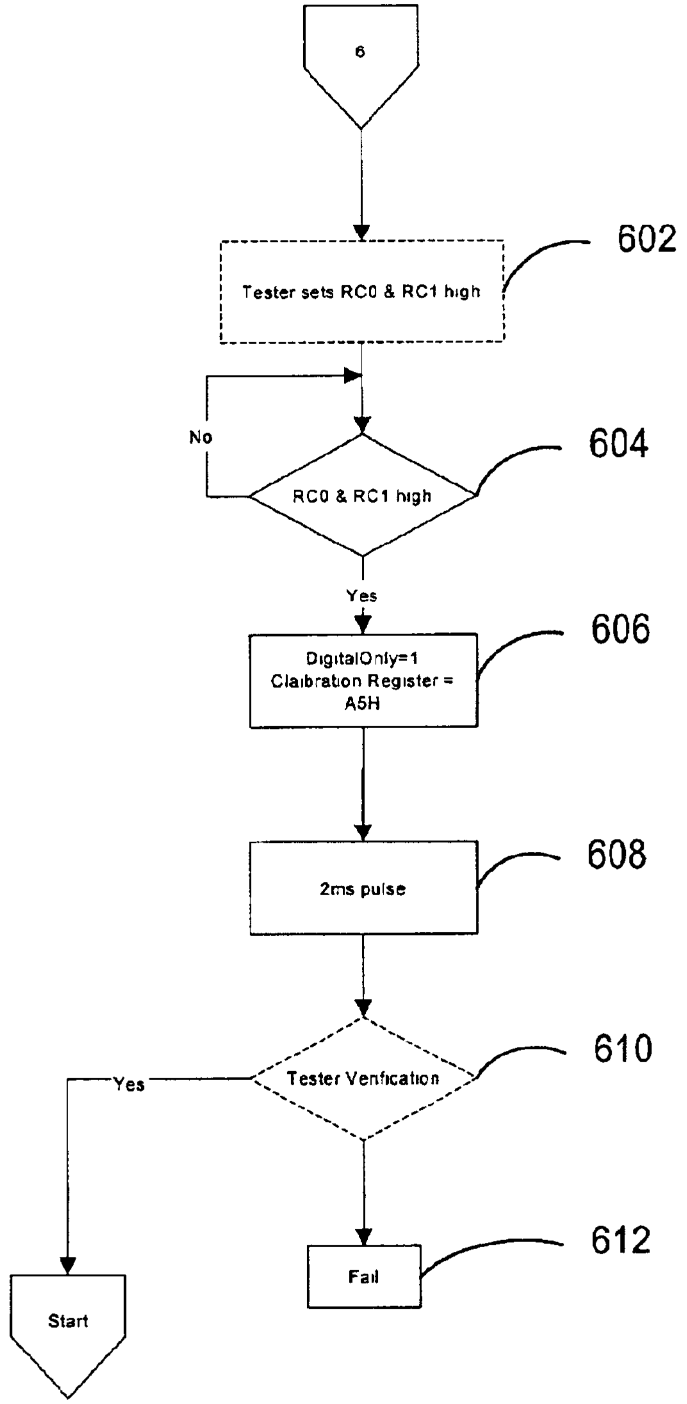

Referring to FIGS. 4–6, the presently preferred calibration process begins at act 400. At act 400, the presently preferred transmitter 100 is coupled to a power source such as a programmable power supply 116. At act 402, the presently preferred transmitter 100 is awakened. Preferably, the presently preferred test fixture 102 programs the content of the oscillator calibration register with a starting value and further programs a calibration register with a calibration value, such as "D0H." Preferably, the oscillator calibration register and the calibration register are retained in a memory 108 resident to the microprocessor 104. Preferably, the memory is an electrically erasable read only memory ("EEPROM"), although other programmable memories can be used in alternative preferred embodiments.

At act 404, the presently preferred transmitter 100 reads the calibration register. When an expected value is read, such as a "DOH," the presently preferred calibration process begins, otherwise the presently preferred transmitter 100 operates in a normal mode. At act 404 the calibration process generates a look up table in the EEPROM 108. Preferably, the look up table retains the K-factor, and voltage and temperature compensation values that are used as references in a presently preferred timing circuit adjustment algorithm.

At act 406, a memory pointer (e.g., EE_PTR), a K_flag, a number of voltages (e.g., NumVoltages), the K-factor (e.g., K) are initialized. The oscillator calibration register is initialized with a value so that discontinuities of the oscillator are avoided. Preferably, the memory pointer points to a first data entry within the look up table and the K-flag identifies whether the K-factor has been programmed. Preferably the K-factor ensures that the bit time period is substantially constant.

The presently preferred calibration process continues by adjusting and validating the K-factor before adjusting and validating the contents of the oscillator calibration register. Preferably, the presently preferred test fixture 102 programs the K-factor and the contents of the oscillator calibration register using Up/Down commands that tune the K-factor and the contents of the oscillator calibration register across a range of voltages that comprise the operating voltage range of the presently preferred transmitter 100. By controlling two inputs of the presently preferred transmitter 100, RC0 and RC1, the presently preferred transmitter 100 generates an output pulse proportional to a software-timing loop. While the presently preferred transmitter 100 can transmit a signal within a broad frequency range, for the purpose of explanation the fixed timing loop is preferably tuned to about one millisecond at about a four megahertz "clock" frequency.

Referring again to FIG. 4, at act 408 a presently preferred transmitter 100 detects weather RC0 and RC1 are driven to a logic high state. If RC0 and RC1 are not at a logic high state, the presently preferred test fixture 102 drives RC0 and RC1 to a logic high state at act 416. When RC0 and RC1 are driven to a logic high state, the presently preferred transmitter 100 responds by generating a reference pulse at act 410. At act 412, the presently preferred test fixture 102 determines whether the reference pulse width is greater than or less than a reference period. In this presently preferred embodiment, the reference period is preferably about one-millisecond, although other reference periods can also be used in alternative preferred embodiments.

When the presently preferred test fixture 102 determines the reference pulse width is longer than the reference period, the presently preferred test fixture 102 drives RC0 to a logic high state and RC1 to a logic low state at act 412. When the presently preferred test fixture 102 determines that the reference pulse width is less than the reference period, the presently preferred test fixture 102 drives RC0 to logic low state and RC1 to a logic high state at act 412. When the presently preferred test fixture 102 determines the reference pulse width is substantially equal to the reference period, the presently preferred test fixture 102 drives RC0 and RC1 to a logic low state at act 412.

When RC0 is at a logic high state and RC1 is at logic low state, the presently preferred transmitter 100 evaluates the K-flag at acts 414 and 502 as seen in FIGS. 4 and 5. If the K-factor has not been programmed, the K_flag will be at a logic low state and the K-factor is incremented at act 504. The presently preferred test fixture 102 then drives RC0 and RC1 high at act 420. When the K-factor is programmed, the K_flag will be at a logic high state and the presently preferred transmitter 100 increments the contents of the oscillator calibration register at act 506. Preferably, the presently preferred test fixture 102 then drives RC0 and RC1 to a logic high state at act 420.

When the presently preferred test fixture 102 determines that the reference pulse width is shorter than the reference period, the presently preferred test fixture 102 drives RC0 to logic low state and RC1 to a logic high state at act 412. At these states, the presently preferred transmitter 102 evaluates the K-flag at acts 424 and 506. If the K-factor has not been programmed, the K_flag will be at a logic low state and the K-factor is decremented at act 508. The presently preferred test fixture 102 then drives RC0 and RC1 to a logic high state at act 420. When the K-factor is programmed, the K_flag will be at a logic high state and the presently preferred transmitter 100 decrements the contents of the oscillator calibration register at act 510. The presently preferred test fixture 102 then drives RC0 and RC1 to a logic high state at act 420.

When the presently preferred test fixture 102 determines the reference pulse width generated by the presently preferred transmitter 100 is substantially equal to the reference period, the presently preferred test fixture drives RC0 and RC1 to a logic low state at act 412. In response, the presently preferred transmitter 102 evaluates the K-flag at act 512. If the K-factor has not been programmed, the K-factor is written into the look up table within the memory 108, such as the EEPROM, and the K-flag is programmed to a logic high state at act 514. If the K-factor has been programmed before act 514, at act 516 the contents of the oscillator calibration register and a memory write time are stored within the look up table stored within the memory 108. Preferably, the memory write time is used to determine an ambient temperature of the presently preferred transmitter 100. At act 518, the memory pointer EE_PTR is incremented and the voltage count is decremented. The above presently preferred process is then repeated until the entire operating voltage range has been calibrated by tracking a voltage index as shown in act 520. In this presently preferred embodiment, the calibration process steps through about two to three and one-tenth volts in increments of about 100 milli-volts as the presently preferred test fixture adjusts supply voltage at act 418. In other alternative preferred embodiments, other voltage ranges and increments can be used.

Once the K-factor and contents of the oscillator calibration register have been established, and retained within the memory 108, preferably an EEPROM, a DigitalOnly flag is programmed to a logic high state, the presently preferred calibration register is programmed with a second reference, here "A5H," and RC0 and RC1 are driven to logic high states at acts 602–606 of FIG. 6. In response, the presently preferred transmitter 100 generates a two milli-second digital pulse at act 608 that is analyzed and validated at act 610 by the presently preferred test fixture 102. In this presently preferred embodiment, the two milli-second digital pulse is generated at act 608 and the calibration register is reprogrammed with a value other than the expected "DOH" value, here "AH5" at act 606. If the two milli-second digital pulse is validated at act 610, the DigitalOnly flag is programmed to a logic low state at act 422 of FIG. 4 before the presently preferred calibration process is completed at act 426 of FIG. 4. Preferably, this ends the calibration sequence.

In this presently preferred embodiment, after the EEPROM 108 has been programmed, the presently preferred test fixture 102 issues a pulse on RC0 and RC1 within about thirty two milliseconds to simulate a switching event. This switch event triggers the presently preferred transmitter 100 to transmit a radio frequency modulation signal. At act 610, a radio frequency modulating signal is validated without a radio frequency circuit 110 transmitting a radio frequency signal. The data appears only on a digital output line. If validated, the presently preferred transmitter 102 goes into a normal operation mode. If verification fails as shown in FIG. 6, the presently preferred transmitter 100 is failed at act 612.

Figure 7:
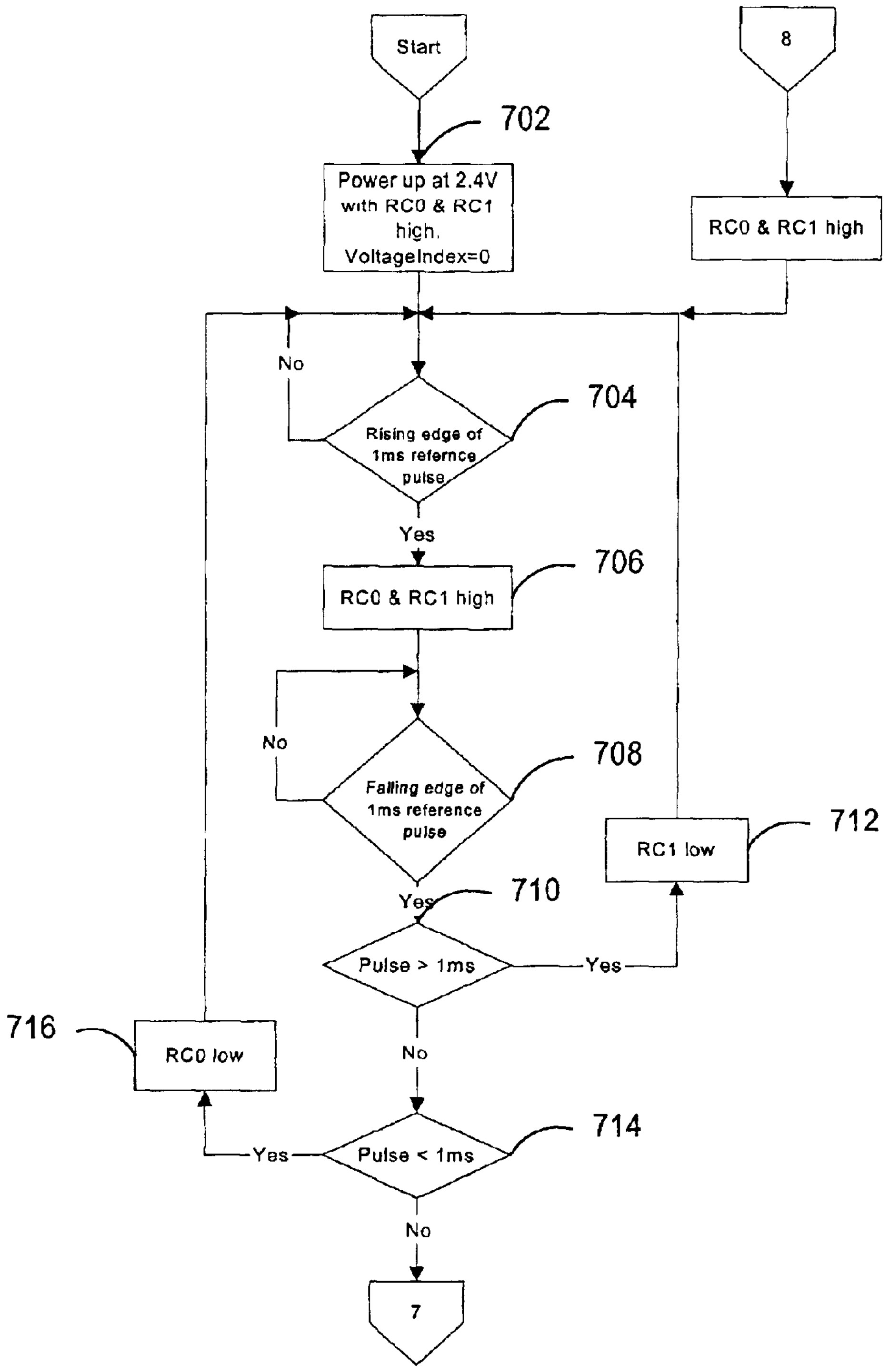
FIGS. 7–9 are flow diagrams of a preferred operation of a preferred test fixture.

FIG. 7 shows a flow diagram of a presently preferred operation of the presently preferred test fixture 102. At act 702, the presently preferred test fixture 102 powers up the presently preferred transmitter 100 to a preferred operating voltage generated by the programmable power supply 116. In this presently preferred embodiment, the preferred operating voltage of the presently preferred transmitter 100 is about two and four tenths volts. After the presently preferred transmitter 100 is powered up, the voltage index is initialized (e.g., VoltageIndex=0) and two inputs to the presently preferred transmitter 100, RC0 and RC1 are driven to a logic high state at act 702. In this presently preferred embodiment, RC0 and RC1 are also inputs into the presently preferred microprocessor 104. When the presently preferred transmitter 100 recognizes that input lines RC0 and RC1 are driven high, the presently preferred transmitter 100 generates a reference signal that is preferably about one millisecond in length.

When the presently preferred test fixture 102 receives the rising edge of the reference signal, the presently preferred test fixture 102 assures that RC0 and RC1 are driven high at act 706. The presently preferred test fixture 102 further prepares a receiver within the presently preferred test fixture 102 to detect the negative or falling edge of the reference signal. When the presently preferred test fixture 102 detects the falling edge of the reference signal, the presently preferred embodiment calculates the pulse width or duration of the reference signal at act 708. If the pulse width of the reference signal is greater than about the desired time interval at act 710, the presently preferred test fixture 102 drives an input to the presently preferred transmitter RC1 to a logic low state at act 712. If the pulse width of the reference signal is less than about the desired time interval at act 714, the presently preferred test fixture 102 drives an input to the presently preferred transmitter RC0 to a logic low state at act 716.

Figure 8:
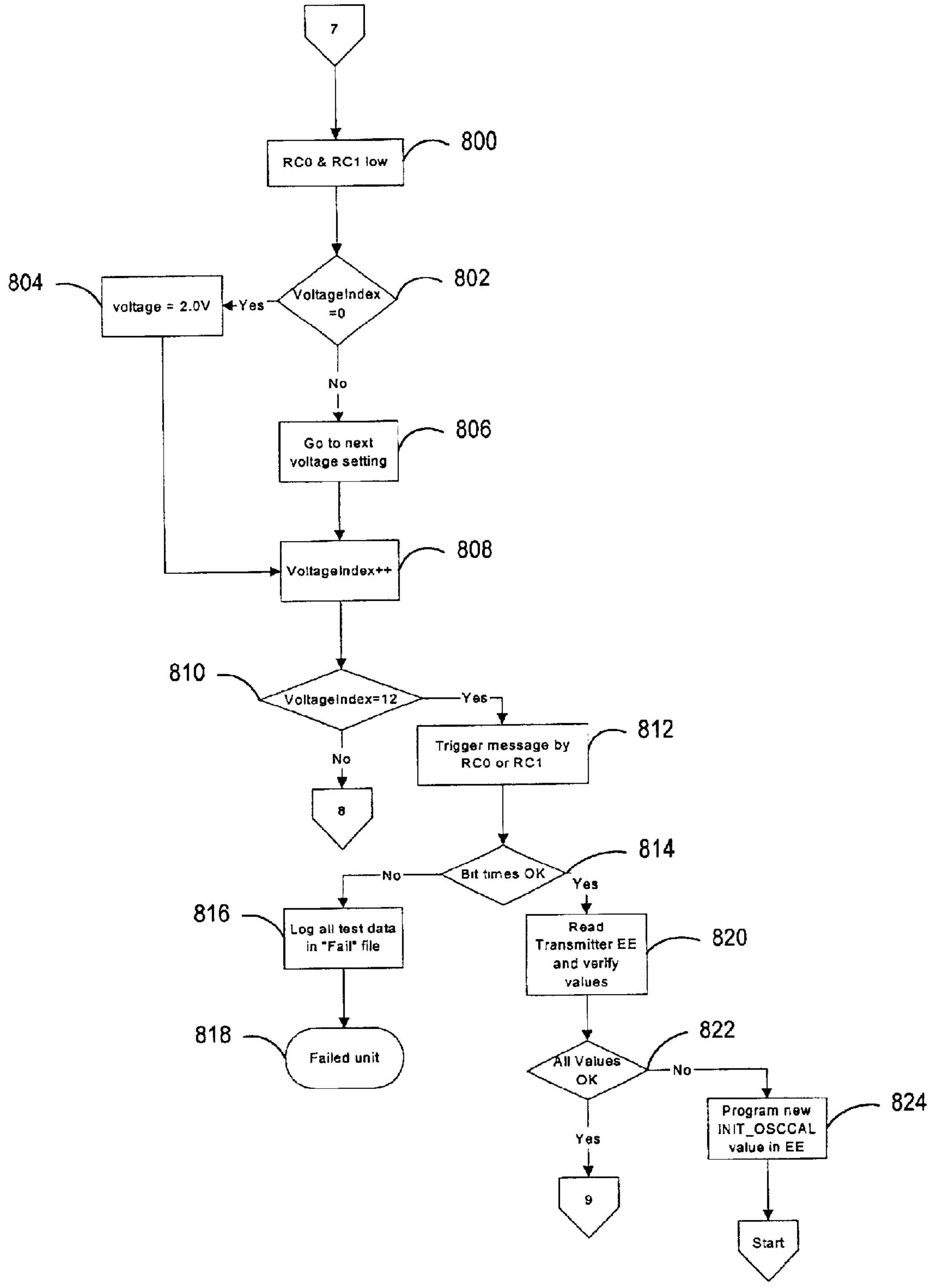

As seen in FIG. 8, when the pulse width of the reference signal is about the desired time interval, the presently preferred test fixture 102 drives both RC0 and RC1 low at act 800 and determines whether any other operating voltages have been calibrated at act 802. If only a first operating voltage has been calibrated, preferably the programmable power supply 116 is initialized at act 804. Otherwise, at act 806, the programmable power supply 116 is incremented. Preferably, the programmable power supply 116 is incremented to a next voltage in increments of about one hundred milli-volts. At act 808, the voltage index is incremented. At act 810, the presently preferred test fixture 102 determines whether the entire operating voltage range of the presently preferred transmitter 100 has been calibrated. If the entire operating voltage range of the presently preferred transmitter 100 has not been calibrated, the presently preferred test fixture 102 repeats the presently preferred calibration process at link 8 of FIG. 7. If the entire operating voltage range has been calibrated, the presently preferred transmitter 100 enters a normal operation.

As further seen in FIG. 8, the presently preferred test fixture 102 also evaluates the bit times when the presently preferred transmitter 100 sends data. At act 812, the presently preferred transmitter 100 enters a normal operation. In this presently preferred embodiment, it may also be referred to as a normal fob operation. Preferably, the presently preferred test fixture 102 triggers a message by simulating a switch input through input lines RC0 and RC 1 at act 812. At act 814, the bit times are verified. If the bit times fail, the presently preferred test fixture 102 logs the failure in a remote or unitary database of the presently preferred test fixture 102 and the presently preferred transmitter 100 is failed at acts 816 and 818.

If the bit times are verified at act 814, the presently preferred test fixture 102, verifies the K-factor and contents of the oscillator calibration register across the operating voltage range of the presently preferred transmitter 100 at acts 820 and 822. Preferably, the presently preferred test fixture 102 also programs a unique identifying code into each presently preferred transmitter at act 820. If the values stored in the look up table fail verification at act 822, the presently preferred test fixture 100 reinitializes the contents of the oscillator calibration register and the preferred calibration process is repeated at act 824 and at the start link shown in FIG. 7.

Figure 10A:
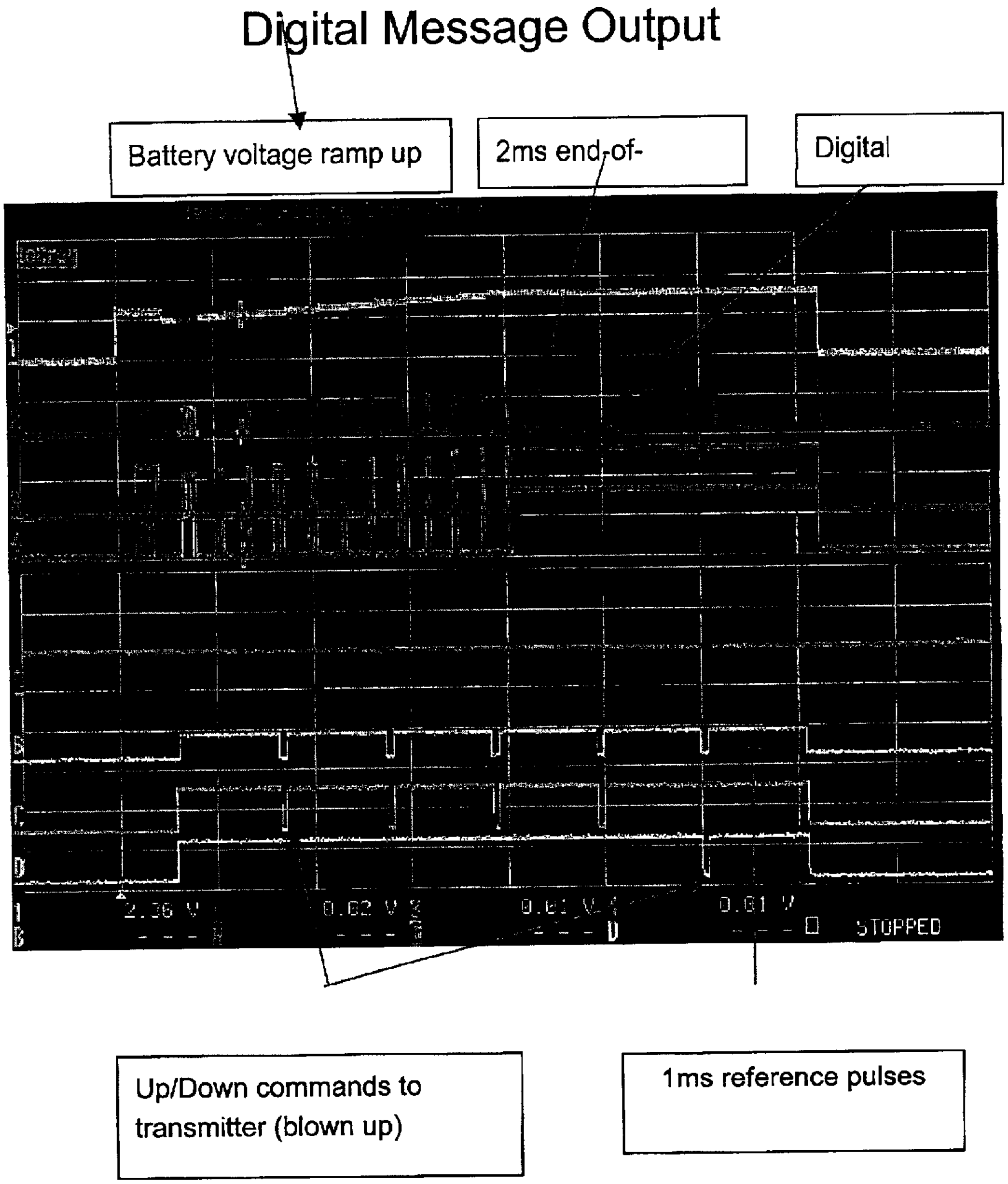
FIGS. 10A and 10B are exemplary graphs of select outputs of the presently preferred test fixture and presently preferred transmitter.
Figure 10B:
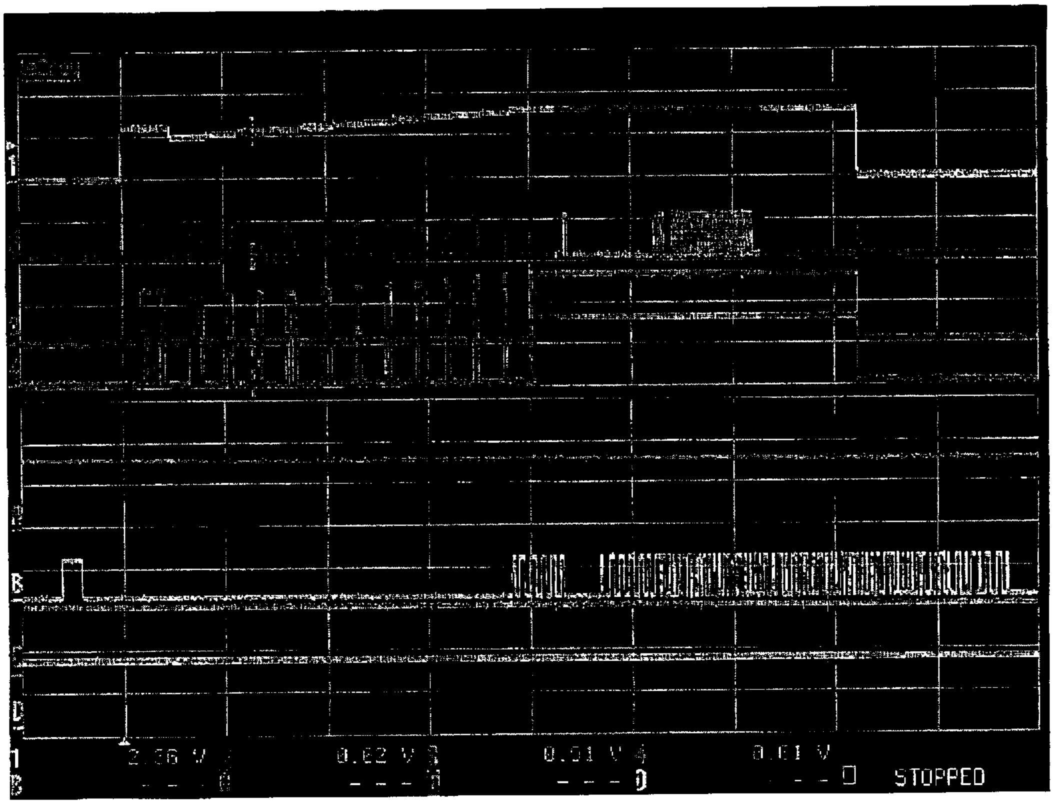

FIGS. 10A and 10B are exemplary graphs of select outputs of the presently preferred transmitter 100 and test fixture 102. As shown, the battery voltage, which is simulated by the programmable power supply 116, preferably ramps up at 100 milli-volt increments. These figures further show that the two milli-second pulse described in act 608 of FIG. 6 is generated on the digital output channel and further shows the Up/Down commands that tune the exemplary one-milli-second reference pulse.

III. Current Draw

Figure 9:
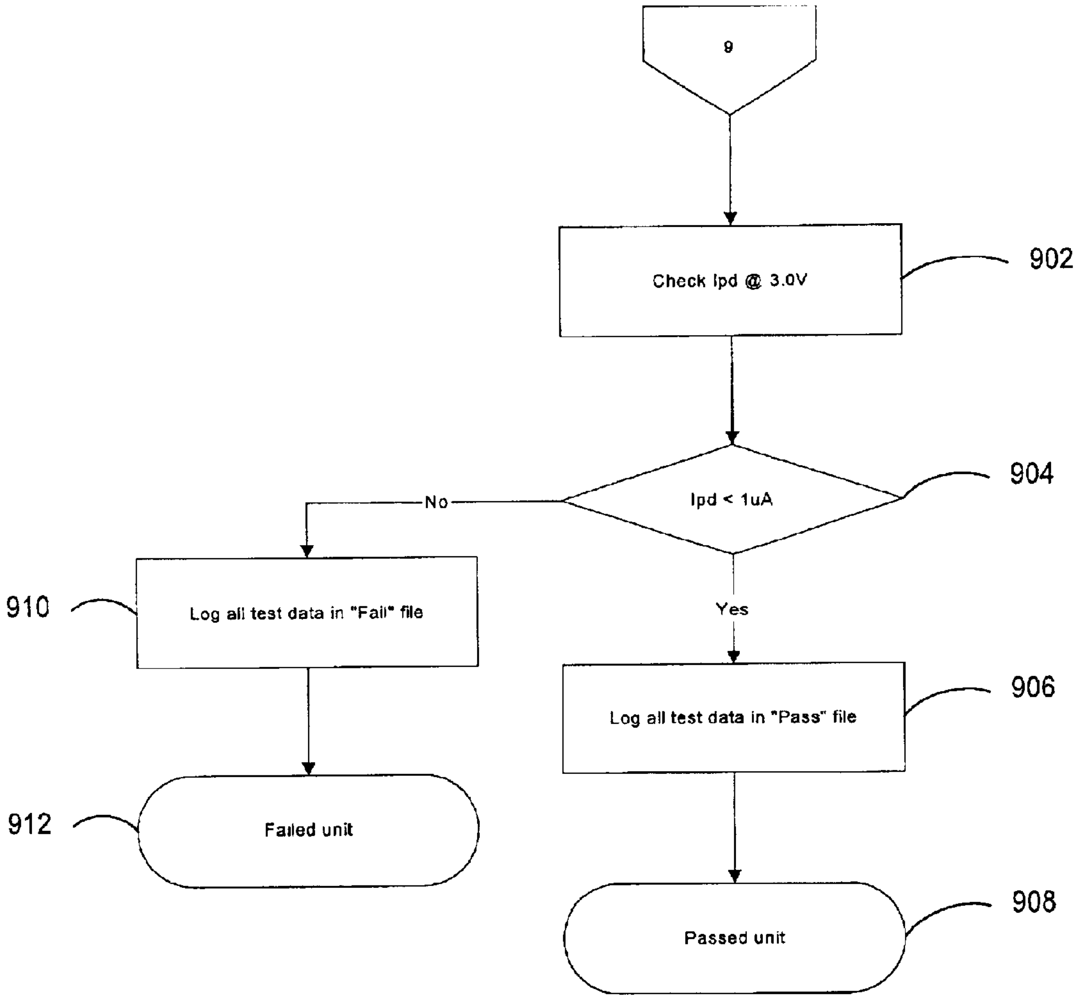

Once the K-factor and contents of the oscillator calibration register are verified, the presently preferred test fixture 102 monitors current drawn by the presently preferred transmitter 100 when the presently preferred transmitter 100 is in a sleep mode as shown in FIG. 9. Preferably, the presently preferred test fixture 102 monitors the sleep current or average sleep current during a sleep interval. At act 902, the programmable power supply 116 is initialized and the sleep current drawn by the presently preferred transmitter 100 is measured. If the sleep mode consumes less than a referenced current at act 904, in this presently preferred embodiment that being less than about one microampere, the presently preferred test fixture 102 logs a database entry at act 906 and the presently preferred transmitter 100 is passed at act 908. However, if the sleep mode consumes more than about one microampere, the presently preferred test fixture 102 logs a database entry at act 910 and the presently preferred transmitter 100 is failed at act 912.

In view of the foregoing description, it should be noted that the above test can also measure the presently preferred transmitter's 100 operating current consumed during a wakeup interval and the operating and sleep current consumed during a transition between a wakeup and a sleep interval. Moreover, these currents may also be measured across a desired temperature range and evaluated against many other voltage reference ranges.

IV. Switch Debounce During RF Transmission

Figure 11:
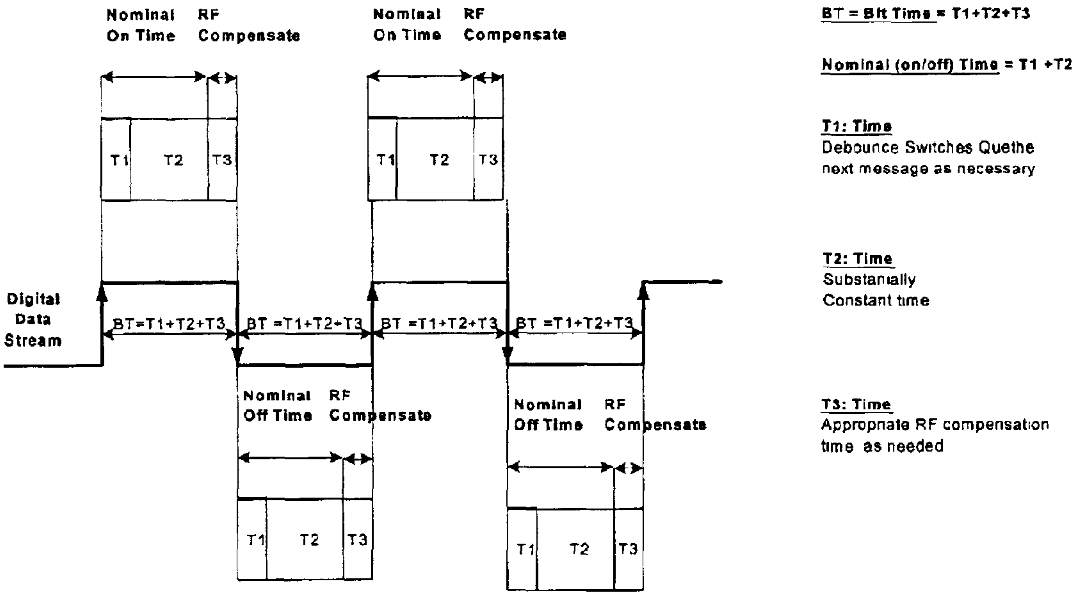
FIG. 11 is a second exemplary timing diagram of a preferred digital data stream generated by the preferred transmitter.

FIG. 11 is a second exemplary timing diagram of a preferred digital data stream. As shown, the timing diagram includes the time needed to detect a switch activation during time interval T1 and a stretch time or radio frequency compensation time T3. As described, the opening and closing of a switch may not generate a uniform signal as the switch output transitions between logic states. To ensure that a transient does not cause the presently preferred microprocessor 104 to detect a phantom switching event, preferably a debounce period T1 is added to the substantially constant time T2 in this presently preferred embodiment. Preferably, this debounce period T1 allows a switch logic debounce routine ("Switch Manager") to determine if a valid switch event occurred and queues the button command without interrupting a radio frequency transmission. Preferably, the Switch Manager is embedded within a software transmission routine. In this presently preferred apparatus and method, switching events are not missed and the debouncing of the switches are serviced on a standard and deterministic interval. Because, the switch debounce is embedded in the transmit routine the presently preferred microprocessor 104 does not have to service an interruption or poll an input to recognize a switch event. In some instances, these events can create bit timing errors. Preferably, the switch debounce can be incorporated into any bit encoding method including a pulse width modulation or a Manchester encoding method, for example.

Figure 12:
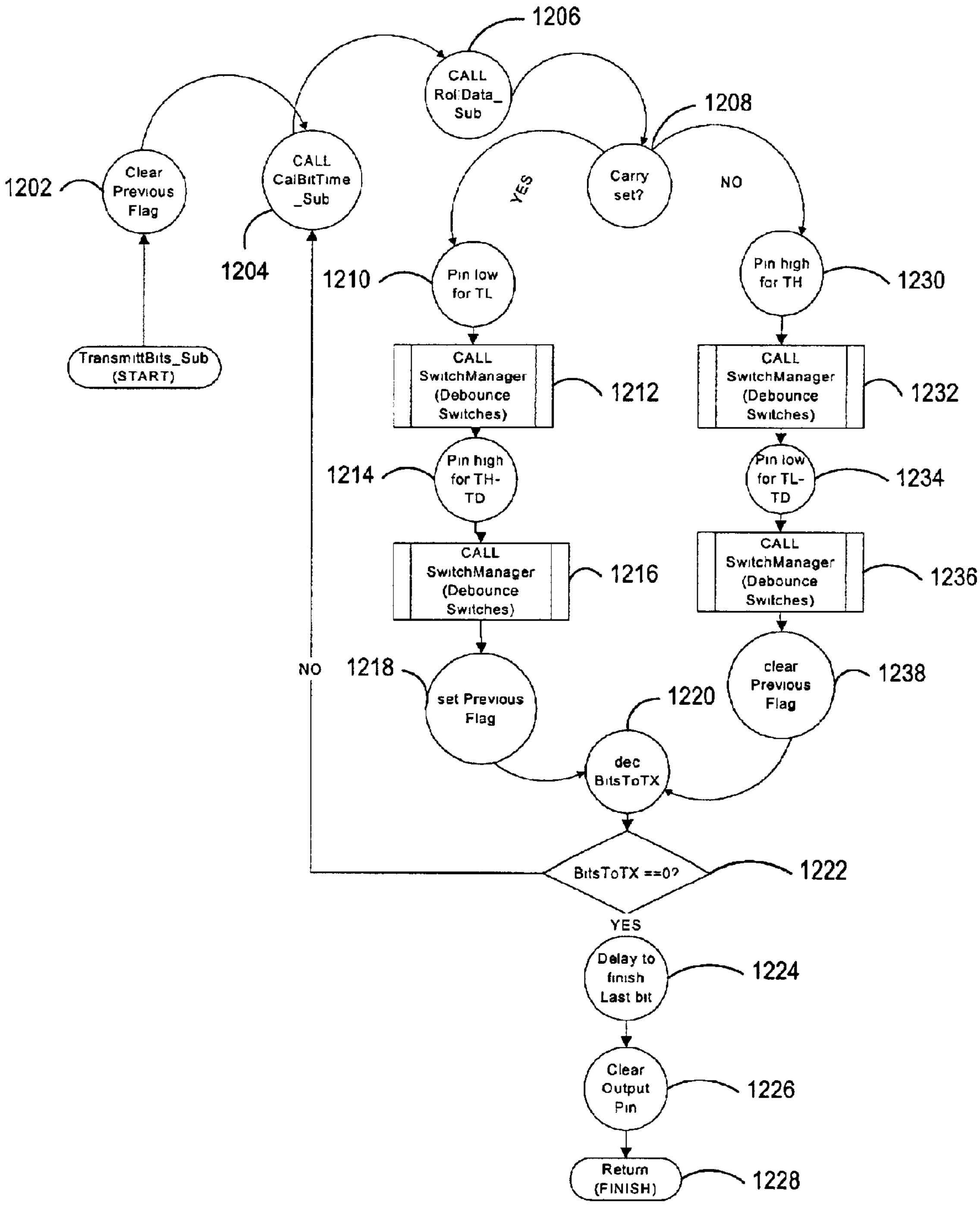
FIG. 12 is an exemplary flow diagram illustrating a preferred process for transmitting data.

FIG. 12 is exemplary flow diagram illustrating a preferred process for transmitting data. Preferably, the flow diagram incorporates a stretch time within any encoding method including a pulse width modulation method. In this presently preferred embodiment, a Manchester encoding method is used. Preferably, the presently preferred Manchester encoding is a synchronous encoding in which actual data is not directly transmitted as a sequence of ones and zeros. Instead, in the presently preferred Manchester encoding, a logic one is transmitted by a zero to one transition near a center of the bit timing period and a logic zero is encoded as a transition from a one to a zero near a center of the bit timing period.

V. Stretch Time

Preferably, the presently preferred Manchester encoding can be encoded within a time period that includes the stretch time or radio frequency compensation. Preferably, the stretch time compensates for the pulse width reduction due to the time needed to power up a radio frequency transmission circuit. This reduced pulse width results in bit time errors in an AM-RF receiver. Some AM-RF receiver detects the envelope of the received signal. The stretch time compensation substantially eliminates or entirely eliminates this error. Referring to FIG. 1, the presently preferred microprocessor 104 is electrically coupled to a radio frequency circuit 110 that modulates and amplifies as continuous signal using a digital output of the presently preferred microprocessor 104. The radio frequency circuit 110 can preferably transmit within any frequency range, but more preferably transmits at about 315 MHz or 433.92 MHz. Preferably, the radio frequency circuit 110 transmits over one or more frequency channels in which transmission may or may not be periodic depending on the requirements of the application.

As shown in the truth table below (Table 1), by evaluating three consecutive bits, the bit timing period can be substantially constant by modifying the period of the high and low time of a binary digit. Preferably, the stretch time compensates for the rise time of a bit as the radio frequency circuit 110 powers up before transmitting a logic high. To compensate for these power up delays, preferably the presently preferred transmitter 100 provides a longer initial generating period for the high portion of a bit as needed. To maintain a constant bit time period under this circumstance, preferably the nominal bit time of the low portion of the bit is correspondingly shortened when needed to ensure a substantially constant bit transmission times. Preferably, the presently preferred transmitter examines a transmission buffer 112 resident to the presently preferred microprocessor 104 prior to transmitting a bit. A previous bit, a current bit, and a next bit are used to calculate the appropriate high and low times of a bit. As shown in the truth table below, TP is the nominal bit time, TR is a stretch time compensation, TH is the high time of the bit and TL is the low time of the bit.

TABLE 1

Presently Preferred Stretch Time Calculation

| Previous Bit | Current Bit | Next Bit | TH | TL |
|---|---|---|---|---|
| 0 | 0 | 0 | TR + TP | TP − TR |
| 0 | 0 | 1 | TR + TP | TP |
| 0 | 1 | 0 | TR + TP | TP − TR |
| 0 | 1 | 1 | TR + TP | TP − TR |
| 1 | 0 | 0 | TP | TP − TR |
| 1 | 0 | 1 | TP | TP |
| 1 | 1 | 0 | TR + TP | TP − TR |
| 1 | 1 | 1 | TR + TP | TP − TR |

VI. Data Transmission

Referring again to FIG. 12, the exemplary flow diagram illustrates a presently preferred process for transmitting data. Preferably, the process paths have a substantially equal and deterministic time. As shown, the presently preferred data transmission begins by clearing a previous flag at act 1202. Preferably, the flag is retained in a region of memory 108 that holds data that is waiting to be transferred. At act 1204, the presently preferred transmission routine calls a calculate bit time subroutine. Preferably, the calculate bit time subroutine calculates the high and low time of the bit transmission. The calculate bit time subroutine preferably uses the presently preferred stretch times described in Table 1. Each time a bit is transmitted, preferably the high and low time of the bit is calculated using the previous bit, the current bit, and the next bit.

At act 1206, the presently preferred transmission routine calls a rolldata subroutine. Preferably, the presently preferred rolldata subroutine shifts out a first bit. If the bit is a logic one, the carry is also set at act 1206. When the carry is set at act 1208, the presently preferred transmission routine drives the modulating output low for a period "TL" at act 1210. In the presently preferred Manchester encoding, a logic one is translated into a logic zero to a logic one transition near the center of the bit timing period. In other words, a logic one is translated into an upward transition near the center of the bit timing period.

At act 1212 the presently preferred transmission routine calls the presently preferred SwitchManager which controls the switch logic debounce routine. Preferably, the presently preferred SwitchManager determines if a valid switch event occurred and queues a switch command if such event has been detected.

At act 1214 the presently preferred transmission routine drives the modulating output high for a period "TH—TD." Preferably, this act establishes the upward transition near the bit center time period that identifies a logic one. At act 1216, the presently preferred SwitchManger is called to identify any switch events that may have occurred during the transmission. At act 1218, preferably the previous bit flag is set. At act 1220 the Bits-to-transmit, which is a counter that tracks the number of bits to be transmitted, is decremented. If the Bits-to-transmit is not zero at act 1222, the presently preferred process continues with the calculate bit time subroutine at act 1204. However, if the last bit has been transmitted, the presently preferred transmission routine initiates a delay and clears the output at acts 1224 and 1226. At act 1228, the presently preferred transmission routine ends and the presently preferred transmitter 100 enters a sleep mode.

Preferably, the presently preferred transmission process also transmits logic lows. As seen in FIG. 12, when the carry is not set at act 1208, the presently preferred transmission routine drives the modulating output high for a period "TH" at act 1230. In the presently preferred Manchester encoding, a logic zero is translated into a logic one to a logic zero transition near the center of the bit timing period. In other words, a logic zero is translated into a downward transition near the center of the bit timing period.

At act 1232 the presently preferred transmission routine calls the presently preferred SwitchManager which controls the switch logic debounce routine. Preferably, the presently preferred SwitchManager determines if a valid switching event occurred and queues a switch command if such event has been detected.

At act 1234 the preferred transmission routine drives the modulating output low for a period "TL—TD." Preferably, this act establishes the downward transition near the bit center that identifies a logic zero. At act 1236, the presently preferred SwitchManger is called to detect any switch events that may have occurred during the transmission. At act 1238, preferably the previous bit flag is cleared. At act 1220, the Bits-to-transmit is decremented. If the Bits-to-transmit is not zero at act 1222, the presently preferred process continues with the bit time subroutine at act 1204. However, if the last bit has been transmitted, the presently preferred transmission routine initiates a delay and clears the output at act 1224 and 1226. At act 1228, the presently preferred transmission routine ends and the presently preferred transmitter enters a sleep mode.

The presently preferred Remote Keyless Entry System embodiments described above utilize a timing circuit 106 that is a unitary part of a microprocessor 104 or microcontroller. While preferably implemented in about the three hundred and fifteen-megahertz United States frequency band, other presently preferred Remote Keyless Entry System embodiments can also be implemented including those operating in about the four hundred and thirty three megahertz European frequency band. Preferably, the timing circuit 106 comprises an array of capacitors selected by switches controlled by the contents of the oscillator calibration register. Alternatively, any frequency dependent components unitary and selectable by hardware or software coupled to or unitary with a microprocessor or microcontroller can also be used.

VII. Operation

In operation, the presently preferred transmitter 100 utilizes algorithms that avoid frequency discontinuities and compensate for voltage and temperature variations. In a first presently preferred algorithm, the K-factor is constant after calibration and is used to avoid frequency discontinuities. In this presently preferred algorithm, the K-factor tracks the number of adjustable instructions that must be executed to maintain a substantially constant bit time period. The K-factor is preferably an integer constant.

In a second presently preferred algorithm, the output frequency of the presently preferred timing circuit 106 is adjusted for voltage and temperature variations. In this presently preferred algorithm, a coarse frequency adjustment is made when the presently preferred microprocessor 104 monitors the presently preferred transmitter 100 initial operating voltage. Preferably, the initial operating voltage is cross referenced to an initial frequency value retained in the presently preferred memory 106. The second presently preferred algorithm then performs a temperature compensation that finely adjusts the output frequency of the presently preferred timing circuit 108. Preferably, the temperature compensation is derived through a comparison of memory write times. This presently preferred approach compares a write time to referenced write times resident to a table retained in memory 108. Preferably, any differences between these write time values generate a temperature compensation that compensates for frequency drift caused by temperature changes. In alternative preferred embodiments, any temperature sensing method or apparatus can be used that is independent of the presently preferred timing circuit.

The above-described embodiments are not limited to the above described reference values or coding methods. Moreover, although the above-described presently preferred embodiments were implemented using a Microchip HCS1365 available from Microchip Technology Incorporated of Chandler, Ariz. other microprocessors and/or controllers can also be used. Furthermore, the above-described calibration processes need not include all of the above-described acts. Many portions of the calibration processes can be excluded or executed separately including, for example, the process of checking the radio frequency format in a digital format, the process of validating current draw in a sleep and/or operating mode, the process of switch debouncing and message queuing during data transmission, and the process of calculating a stretch time or radio frequency compensation.

From the foregoing detailed description, it should be apparent that the presently preferred transmitter 100 can be integrated within or can be a unitary part of a key fob, access card, or any other device. Moreover, when the presently preferred embodiment is a part of a hands free apparatus, system and/or method, the process of switch debouncing and message queuing may not be needed as the presently preferred hand free embodiment may not be activated by a switch or a mechanical movement. It should be further noted that although the above-described presently preferred embodiments can be used or integrated with a vehicle, these embodiments can also be used with many other devices, structures, and technologies.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

We claim:

1. A crystal-less remote keyless entry system, comprising:

a microprocessor;

a radio frequency circuit electrically coupled to the microprocessor; and a timing circuit electrically coupled to the microprocessor, the timing circuit being a unitary part of the microprocessor; and a transmission buffer resident to the microprocessor, the transmission buffer being configured to retain a previous bit transmitted by the radio frequency circuit;

wherein the microprocessor is configured to output data having a stretch time that compensates for power up delays in the radio frequency circuit without substantially varying a bit time period of the output data.

2. The crystal-less remote keyless entry system of claim 1 wherein the stretch time provides a longer or a shorter generating period of a high or low time of a bit.

3. A crystal-less remote keyless entry system, comprising:

a microprocessor:

a radio frequency circuit electrically coupled to the microprocessor; and a timing circuit electrically coupled to the microprocessor, the timing circuit being a unitary part of the microprocessor;

wherein the microprocessor is configured to output data having a stretch time that compensates for power up delays in the radio frequency circuit without substantially varying a bit time period of the output data and wherein the stretch time maintains a substantially constant bit time period of the output data by adjusting nominal intervals of a high and a low state of a bit.

4. The crystal-less remote keyless entry system of claim 1 wherein the radio frequency signal is configured to transmit a Manchester encoded data.

5. The crystal-less remote keyless entry system of claim 1 wherein the radio frequency signal is configured to transmit a pulse width modulated encoded data.

6. The crystal-less remote keyless entry system of claim 1 wherein the crystal-less remote keyless entry system is a hands free activated system.

7. The crystal-less remote keyless entry system of claim 1 further comprising a mechanical switch electrically coupled to the microprocessor, wherein the mechanical switch is configured to activate the microprocessor.

8. The crystal-less remote keyless entry system of claim 7 wherein the microprocessor is programmed to acknowledge a valid switch event without servicing an interruption or polling an input.

9. The crystal-less remote keyless entry system of claim 7 wherein the microprocessor is configured to detect a switch event without interrupting a radio frequency transmission transmitted by the radio frequency circuit.

10. The crystal-less remote keyless entry system of claim 1 wherein the microprocessor is configured to compensate for a bit time variation.

11. The crystal-less remote keyless entry system of claim 1 wherein the stretch time selectively lengthens the nominal bit high time and shortens the nominal bit low time of an encoded bit.

12. The crystal-less remote keyless entry system of claim 1 further comprising a memory coupled to the microprocessor, wherein the memory retains software that evaluates three consecutive bits that are used to calculate the stretch time.

13. A system for detecting a switch activation in a crystal-less remote keyless entry system, comprising:

a switch;

a microprocessor electrically coupled to the switch;

a radio frequency circuit electrically coupled to the microprocessor; and a timing circuit electrically coupled to the microprocessor, the timing circuit being a unitary part of the microprocessor;

wherein the microprocessor is configured to transmit a bit during a time period that comprises a debounce time interval that allows a switching event to be processed in parallel with a radio frequency transmission from the radio frequency circuit.

14. The system for detecting a switch activation in a crystal-less remote keyless entry system of claim 13 further comprising a test fixture coupled to the microprocessor, wherein the test fixture is further configured to validate an output of the radio frequency circuit without receiving a radio frequency signal transmitted from the radio frequency circuit.

15. The crystal-less remote keyless entry system of claim 13 wherein the switch is a mechanical switch.

16. The system for detecting a switch activation in a crystal-less remote keyless entry system of claim 15 further comprising a memory, the memory having a switch detection routine that determines when a valid switch event occurs between logic levels of a Manchester encoded bit.

17. The system for detecting a switch activation in a crystal-less remote keyless entry system of claim 15 wherein the microprocessor is further configured to queue a switch command when a valid switching event occurs without interrupting a radio frequency transmission transmitted by the radio frequency circuit.

18. The system for detecting a switch activation in a crystal-less remote keyless entry system of claim 13 further comprising a memory coupled to the microprocessor, the memory being programmed with a stretch time.

19. A method of transmitting entry or function data using a crystal-less remote keyless entry system, comprising:

selecting a bit from a data stream; and encoding the bit with a substantially Manchester encoded process that debounces a switch at a bit time period between different logic levels of a substantially Manchester encoded data and queues a switch command when a switch event occurs without interrupting a data transmission.

20. The method of calibrating a crystal-less remote keyless entry system of claim 19 further comprising adjusting a bit time period of the substantially Manchester encoded data with a stretch time.

21. The method of calibrating a crystal-less remote keyless entry system of claim 20 further comprising calculating a stretch time using a previous bit, a current bit, and a next bit.

22. The method of calibrating a crystal-less remote keyless entry system of claim 21 further comprising transmitting the substantially Manchester encoded data.

23. A method of transmitting a code using a crystal-less remote keyless entry system, comprising:

selecting a bit from a data stream;

encoding the bit with a Manchester encoding that debounces a switch at a time period between logic levels of a Manchester encoded data;

adjusting a bit time period of the Manchester encoded data with a stretch time using a previous bit, a current bit, and a next bit; and transmitting the Manchester encoded data.

* * * * *